United States Patent
Jeong (10) Patent No.: US 7,378,315 B2
(45) Date of Patent: May 27, 2008

(54) METHOD FOR FABRICATING SEMICONDUCTOR DEVICE

(75) Inventor: Yong-Sik Jeong, Chungcheongbuk-do (KR)

(73) Assignee: Magnachip Semiconductor Ltd., Chungcheongbuk-do (KR)

( * ) Notice: Subject to any disclaimer, the term of this patent is extended or adjusted under 35 U.S.C. 154(b) by 381 days.

(21) Appl. No.: 11/296,117

(22) Filed: Dec. 6, 2005

(65) Prior Publication Data

US 2006/0246659 A1     Nov. 2, 2006

(30) Foreign Application Priority Data

Apr. 26, 2005    (KR)  ........................ 10-2005-0034713

(51) Int. Cl.
*H01L 21/336* (2006.01)

(52) U.S. Cl. ...................... 438/257; 438/258; 438/266; 438/267; 257/E21.691

(58) Field of Classification Search ................ 438/257, 438/258, 261, 266, 267, 593
See application file for complete search history.

(56) References Cited

U.S. PATENT DOCUMENTS

| 6,018,178 | A  | * | 1/2000 | Sung .......................... 257/316 |
| 6,417,086 | B1 | * | 7/2002 | Osari ......................... 438/594 |
| 6,579,762 | B2 | * | 6/2003 | Io ............................. 438/258 |
| 6,677,203 | B2 | * | 1/2004 | Kusumi et al. ............. 438/267 |

\* cited by examiner

*Primary Examiner*—Michael Trinh
(74) *Attorney, Agent, or Firm*—Blakely, Sokoloff, Taylor & Zafman LLP (57) ABSTRACT

A method for fabricating a semiconductor device for a system on chip (SOC) for embodying a transistor for a logic device, an electrical erasable programmable read only memory (EEPROM) cell and a flash memory cell in one chip is provided. Floating gates of the EEPROM cell and the flash memory cell are formed by using a first polysilicon layer; and a gate electrode of the logic device and control gates of the EEPROM cell and the flash memory cell are formed by using a second polysilicon layer. Thus, it is possible to stably form the logic device, the EEPROM cell and the flash memory cell in one chip.

22 Claims, 6 Drawing Sheets

METHOD FOR FABRICATING SEMICONDUCTOR DEVICE

FIELD OF THE INVENTION

The present invention relates to a method for fabricating a semiconductor device; and more particularly, to a method for fabricating a semiconductor device for a system on chip (SOC) for embodying a transistor for a logic device, an electrical erasable programmable read only memory (EEPROM) cell and a flash memory cell in one chip.

DESCRIPTION OF RELATED ARTS

Recently, a smart card which includes various functions of an identification card, a credit card and an electrical currency in one card has been widely used. The smart card not only stores user's information and transaction information, but also carries programs suitable for the purpose within it. Accordingly, a non-volatile memory device for writing and storing the user's information and the transaction information and a mask ROM device for coding a predetermined program are built in the smart card as one chip type. For instance, in case of an integrated circuit (IC) card such as the smart card, the mask ROM device is used as a system memory and an EEPROM device which is the non-volatile memory device is used as an application memory.

The mask ROM device continuously retains information which has been programmed once in a cell even though there is not a power source. In the mask ROM device, confidential and important information such as user's unique information is stored and thus, the mask ROM device should have strict security against hacking. To program the mask ROM device, an impurity is selectively implanted into a channel region of a cell subjected to a coding during a fabrication process, thereby changing a threshold voltage of the cell. A transistor of the coded cell is referred to as a depletion transistor. The mask ROM device includes the depletion transistor, a transistor not subjected to the coding and a field region isolating the aforementioned two transistors, i.e., a device isolation region.

The mask ROM device provides advantages that the mask ROM device has good compatibility with respect to the logic device and the EEPROM process only through a simple process, and has high reliability of a memory. However, since the process is performed by writing the information after receiving an order from a client, a processing time from the order of the client to a delivery of products takes long. Furthermore, since the chip that has been coded once cannot be sold to another client, a difficulty in handling inventories is resulted. To solve the aforementioned limitations, a ROM device for the smart card applying a flash memory cell which is free to be coded after finishing a process of a wafer is suggested.

As described above, in case of embodying the mask ROM device by using the flash memory cell, a predetermined block of the flash memory cell should be operated as the EEPROM memory cell operates. For instance, to operate the predetermined block of the flash memory cell as the EEPROM operates, a removal operation should be employed in a byte unit. However, the flash memory cell cannot help performing the removal operation in a sector unit because of its property. Accordingly, to make the flash memory cell perform the removal operation in the byte unit, the sector should be divided into smaller sub-sectors. In this case, because a peripheral circuit for operating a device gets complicated, the divided sector cannot be applied to a product requiring an independent operation of the flash memory cell and the EEPROM.

For this reason, a method for embodying the mask ROM device by using the EEPROM cell has been suggested. However, since the EEPROM cell is much larger than the conventional mask ROM device, not only can a desirable capacity not be built-in, but also a size of the chip is generally increased. Accordingly, the method for embodying the mask ROM device by using the EEPROM cell cannot be applied to a product requiring high memory integration.

SUMMARY OF THE INVENTION

It is, therefore, an object of the present invention to provide a method for fabricating a semiconductor device capable of stably embodying a low voltage transistor for a logic device, an electrical erasable programmable read only memory (EEPROM) cell and a flash memory cell in one chip.

In accordance with one aspect of the present invention, there is provided with a method for fabricating a semiconductor device, including: preparing a substrate defined as a first region, a second region and a third region; forming a stack structure on the substrate; exposing the substrate of the first region by etching the stack structure and simultaneously forming a plurality of first floating gates on the second region; forming second inter-poly dielectric layers on sidewalls of the first floating gates and a sidewall of the stack structure remaining on the third region; forming a gate oxide layer on the substrate of the second region exposed in both sides of the first floating gates and on the substrate of the first region; forming a second polysilicon layer over the gate oxide layer, the first floating gates and the stack structure; forming a gate electrode on the substrate of the first region by etching the second polysilicon layer and the gate oxide layer and simultaneously forming control gates on both sidewalls of the second inter-poly dielectric layers existing on the substrate of the second region; and forming second floating gates and second control gates by etching the second polysilicon layer, the second inter-poly silicon layer, the stack structure on the substrate of the third region.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 1 to 11 are cross-sectional views illustrating a method for fabricating a semiconductor device in accordance with a specific embodiment of the present invention.

Figure 1:
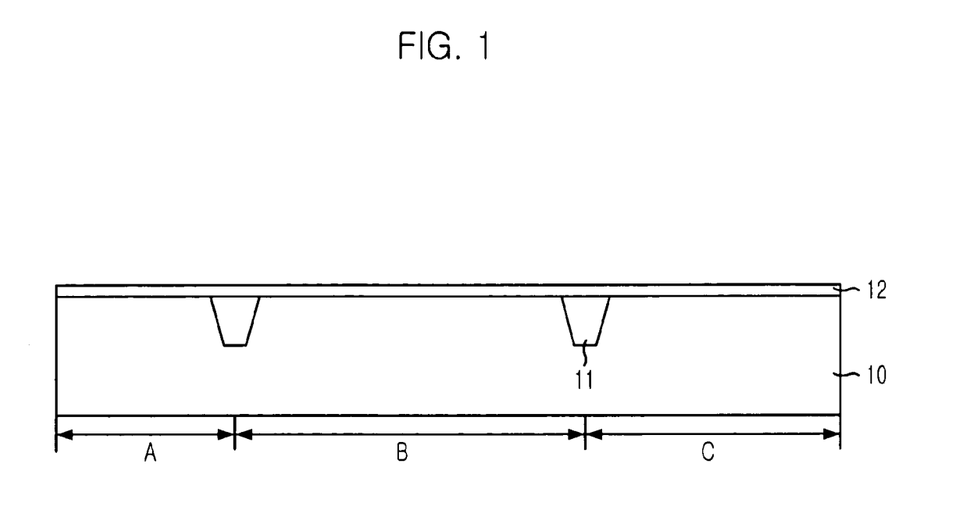
FIGS. 1 to 11 are cross-sectional views illustrating a method for a fabricating a semiconductor device in accordance with a specific embodiment of the present invention.

First, as shown in FIG. 1, a substrate 10 defined as a peripheral circuit region where a logic device will be formed (hereinafter, referred to as "a first region A"), an electrical erasable programmable read only memory (EEPROM) cell region where the EEPROM cell will be formed (hereinafter, referred to as "a second region B"), and a flash region where a flash memory cell will be formed (hereinafter, referred to as "a third region C") is provided.

Next, a plurality of device isolation layers 11 are formed to isolate the first region A, the second region B, and the third region C from each other. At this time, the device isolation layers 11 are formed through a local oxidation of silicon (LOCOS) process or a modified LOCOS process. In addition, in devices requiring the high scale of integration such as sub-quarter micron semiconductor devices, it is preferable to form the device isolation layers 11 through a shallow trench isolation (STI) process.

Next, a predetermined screen oxide layer (not shown) is formed. Afterwards, a well ion-implantation process using the screen oxide layer (not shown) as a mask is performed and thus, a plurality of well regions (not shown) are formed on the substrate 10 of the first region A, the second region B and the third region C respectively.

Next, a tunnel oxide layer 12 is formed on the substrate 10 by performing an oxidation process. At this time, the oxidation process can use either a wet oxidation process or a dry oxidation process. Preferably, the tunnel oxide layer 12 is formed through a thermal oxidation process. Herein, the tunnel oxide layer 12 can be formed by using an oxynitride layer containing nitrogen to prevent the tunnel oxide layer 12 from being easily degraded during an operation of the semiconductor device. Also, since the tunnel oxide layer 12 should not have a lattice defect and have a uniform thickness, the tunnel oxide layer 12 is preferably formed in a thickness ranging form approximately 50 Å to approximately 200 Å.

Figure 2:
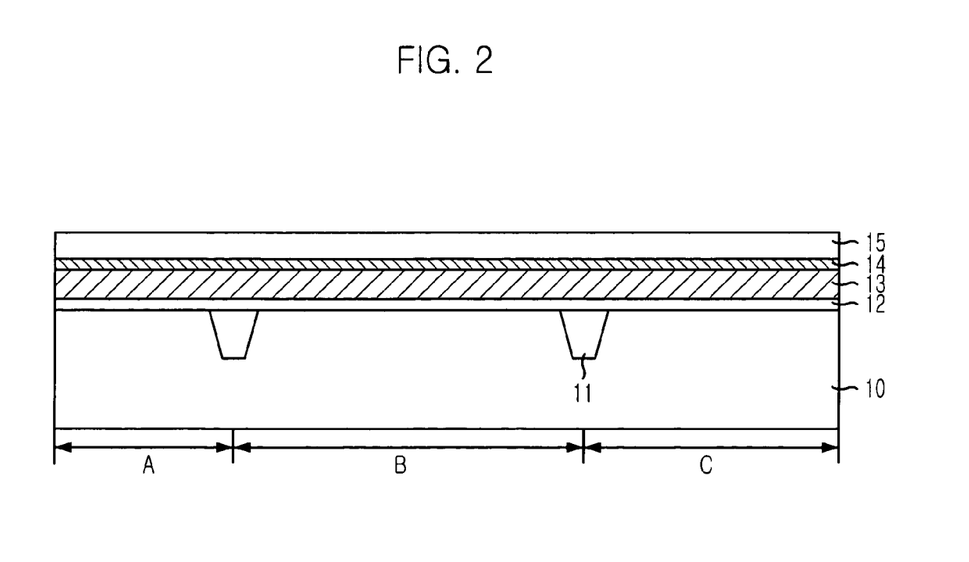

Next, as shown in FIG. 2, a polysilicon layer 13 for a floating gate (hereinafter, referred to as "a first polysilicon layer") is formed on the tunnel oxide layer 12. At this time, the first polysilicon layer 13 is formed in a thickness ranging from approximately 500 Å to approximately 5,000 Å by using a doped or undoped polysilicon layer through a low pressure chemical vapor deposition (LPCVD) method. For instance, in case of using the doped polysilicon layer, the first polysilicon layer 13 is formed by using silylene ($SiH_2$) gas and phosphine ($PH_3$) gas, or disilane ($Si_2H_6$) gas and $PH_3$ gas. On the other side, in case of using the undoped polysilicon layer, the polysilicon layer is doped by adding an impurity during a lightly doped drain (LDD) ion-implantation process or a source/drain ion-implantation process to be performed as a subsequent process.

Next, a first inter-poly dielectric layer 14 is deposited on the first polysilicon layer 13. At this time, the first inter-poly dielectric layer 14 is formed in an oxide/nitride/oxide (ONO) structure.

Next, a hard mask 15 is formed on the first inter-poly dielectric layer 14. At this time, the hard mask 15 is formed by using a material selected from a group consisting of an oxide layer, a nitride layer, an oxynitride layer and a stack layer thereof.

Figure 3:
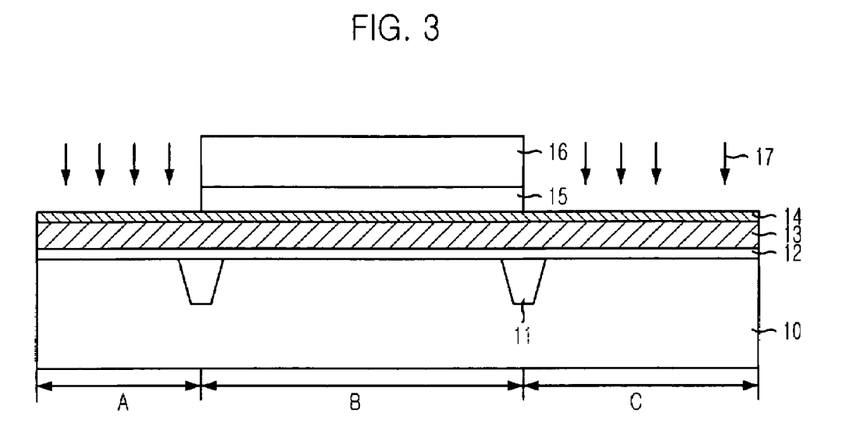

Next, as shown in FIG. 3, a first photoresist layer (not shown) is formed on the hard mask 15. Afterwards, a first photoresist pattern 16 is formed by performing a photo exposure process and a developing process with use of a photoresist mask (not shown). At this time, the first photoresist pattern 16 covers the second region B.

Next, a first etching process 17 using the first photoresist pattern 16 as a mask is performed. Thus, the hard mask 15 existing on the first region A and the third region C except the second region B is etched.

Figure 4:
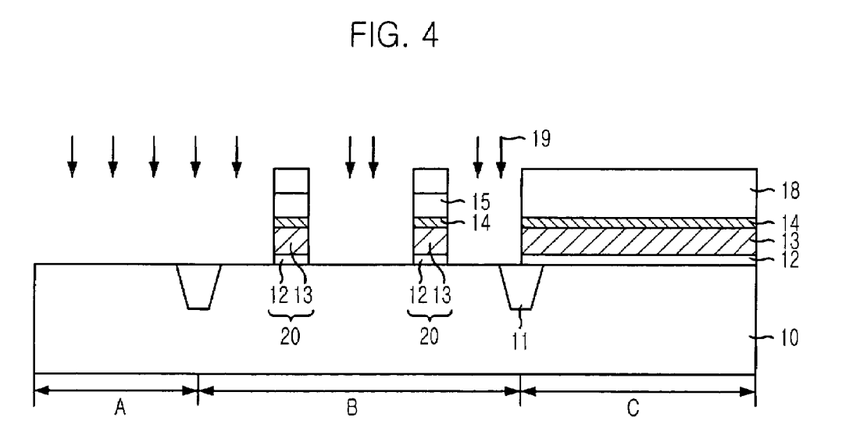

Next, as shown in FIG. 4, a strip process is performed, thereby removing the first photoresist pattern 16 (refer to FIG. 3).

Next, a second photoresist layer (not shown) is formed on the resulting structure in which the hard mask 15 existing on the first region A and the third region C is removed. Afterwards, a photo exposure process and a developing process using the second photoresist layer (not shown) is performed, thereby forming a second photoresist pattern 18. At this time, the second photoresist pattern 18 covers the third region C and opens predetermined portions of the second region B.

Next, a second etching process 19 using the second photoresist pattern 18 as a mask is performed, thereby sequentially etching the hard mask 15, the first inter-poly dielectric layer 14, the first polysilicon layer 13 and the tunnel oxide layer 12 existing on the first region A. Accordingly, a plurality of floating gates 20 (hereinafter, referred to as "first floating gates") for an EEPROM cell are formed on the substrate 10 of the second region B.

Meanwhile, the first floating gates 20 can be formed through two methods. For instance, a first method is as follows. An etching process using the second photoresist pattern 18 as a mask is performed, thereby sequentially etching the hard mask 15, the first inter-poly dielectric layer 14, the first polysilicon layer 13, and the tunnel oxide layer 12. A second method is as follows. An etching process using the second photoresist pattern 18 as a mask is performed, thereby etching the hard mask 15 and the first inter-poly dielectric layer 14 beforehand. Afterwards, the second photoresist pattern 18 is removed. Then, the other etching process using the etched hard mask 15 as an etch mask is performed, thereby etching the first polysilicon layer 13 and the tunnel oxide layer 12.

Hereinafter, a subsequent process with respect the case using only the first method will be explained for the sake of convenience.

Figure 5:
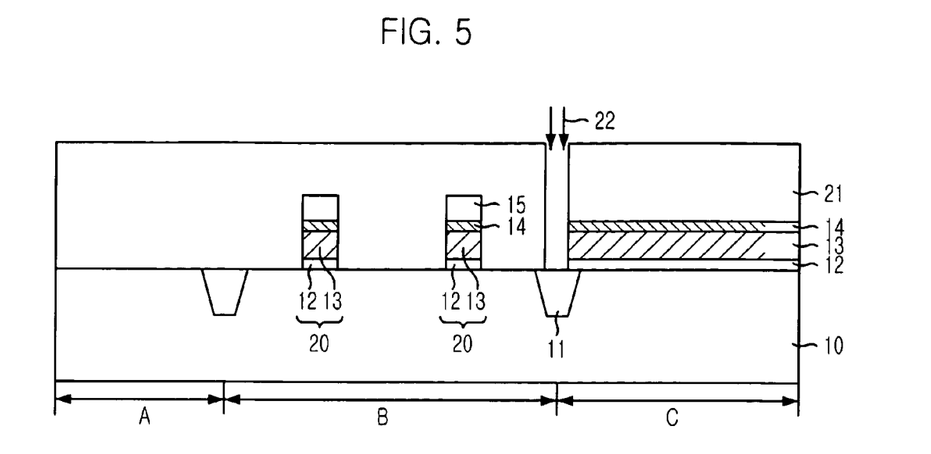

Next, as shown in FIG. 5, a strip process is performed, thereby removing the second photoresist pattern 18 (refer to FIG. 4).

Next, a third photoresist layer (not shown) is deposited on the resulting structure in which the second photoresist pattern 18 is removed. Afterwards, a photo exposure process and a developing process using a photomask (not shown) are performed, thereby forming a plurality of third photoresist patterns 21. At this time, the third photoresist patterns 21 completely cover the first region A and the second region B, and cover a predetermined portion of the third region C.

Next, a third etching process 22 is performed by using the third photoresist patterns 21 as a mask and thus, the first inter-poly dielectric layer 14, the first polysilicon layer 13 and the tunnel oxide layer 12 formed on the substrate 10 of a predetermined portion of the exposed third region C are sequentially etched in a line type.

Figure 6:
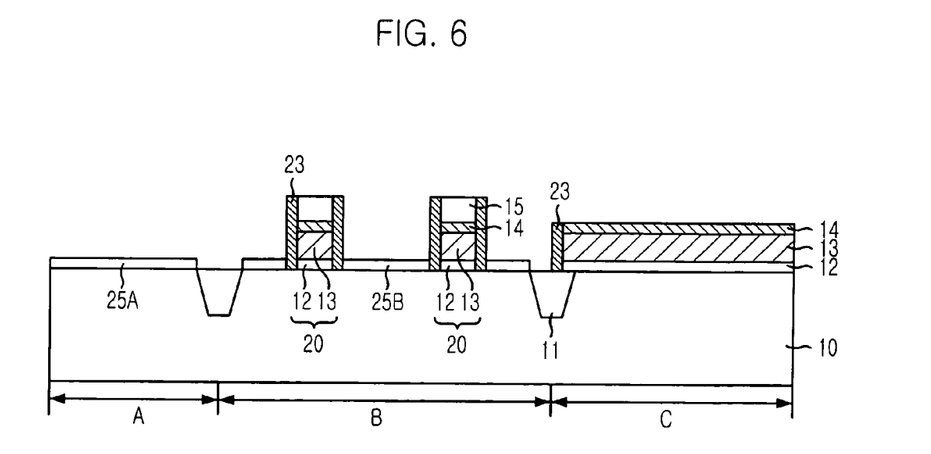

Next, as shown in FIG. 6, a strip process is employed, thereby removing the third photoresist patterns 21 (refer to FIG. 5).

Next, a second inter-poly dielectric layer 23 is deposited over a height difference of the above resulting structure in which the third photoresist patterns 21 are removed. At this time, the second inter-poly dielectric layer 23 can be formed in an ONO structure.

Next, a dry etching process is performed and thus, the second inter-poly dielectric layer 23 remains on both sidewalls of the first floating gates 20 and a sidewall of the resulting structure formed on the substrate 10 of the third region C. Herein, the second inter-poly dielectric layer 23 serves a role of a dielectric layer between the first floating gates 20 and a plurality of first control gates 26A (refer to FIG. 8).

Next, a first gate oxide layer 25A and a plurality of second gate oxide layers 25B are formed on the substrate 10 of the first region A and the second region B respectively. At this time, the first gate oxide layer 25A and the second gate oxide layers 25B may be formed in different thickness according to a property of the individual regions.

In more details, the second gate oxide layer 25B is formed on the substrate 10 of the first region A and the second region B by performing a first oxidation process. Next, a mask process and an etching process are performed and thus, the second gate oxide layer 25B existing on the first region A is removed. Afterwards, a second etching process is performed, thereby forming the first gate oxide layer 25A on the substrate 10 of the first region A.

Herein, the first gate oxide layer 25A is formed in a thickness suitable for an operation voltage of a logic device and thus, the first gate oxide layer 25A is preferably formed in a thickness ranging form approximately 15 Å to approximately 200 Å. Meanwhile, the second gate oxide layer 25B is formed in a thickness tolerate to a program of the EEPROM cell and a removal operation voltage and accordingly, the second gate oxide layer 25B is preferably formed in a thickness ranging from approximately 50 Å to approximately 500 Å.

Figure 7:
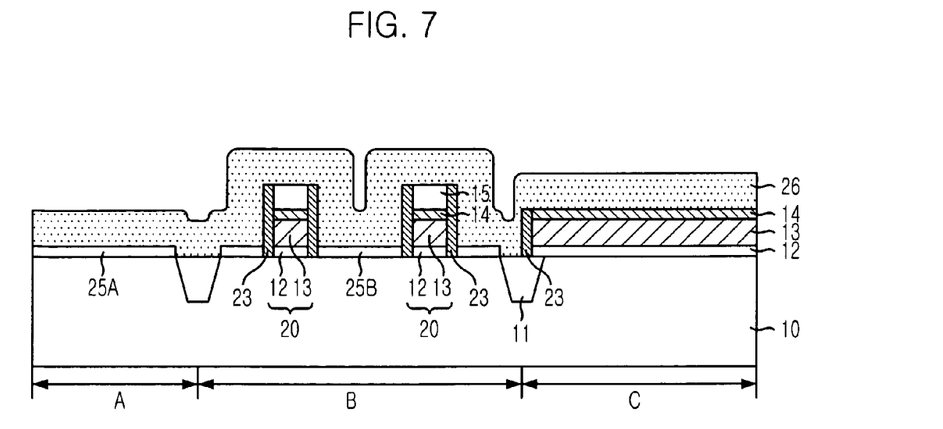

Next, as shown in FIG. 7, a second polysilicon layer 26 (hereinafter, referred to as "a second polysilicon layer") for a control gate and a gate electrode is deposited over the height difference of the resulting structure provided with the second inter-poly dielectric layer 23. At this time, the second polysilicon layer 26 is formed in a thickness ranging from approximately 500 Å to approximately 5,000 Å by using a doped or undoped polysilicon layer through a LPCVD method such as the first polysilicon layer 13.

Figure 8:
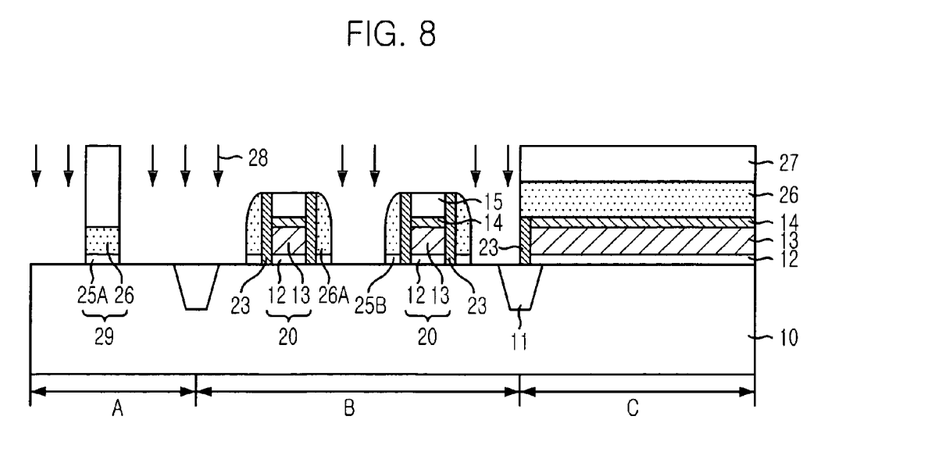

Next, as shown in FIG. 8, a fourth photoresist layer (not shown) is formed on the second polysilicon layer 26. Afterwards, a photo exposure process and a developing process are performed by using the fourth photoresist layer (not shown), thereby forming a fourth photoresist pattern 27.

Next, a fourth etching process 28 is employed by using the fourth photoresist pattern 27 as a mask. Thus, a gate electrode 29 of a logic device is formed on the substrate 10 of the first region A, and a plurality of first control gates 26A are formed on sidewalls of the second inter-poly dielectric layers 23. At this time, the first control gates 26A are isolated form the substrate 10 through the plurality of second gate oxide layers 25B.

Figure 9:
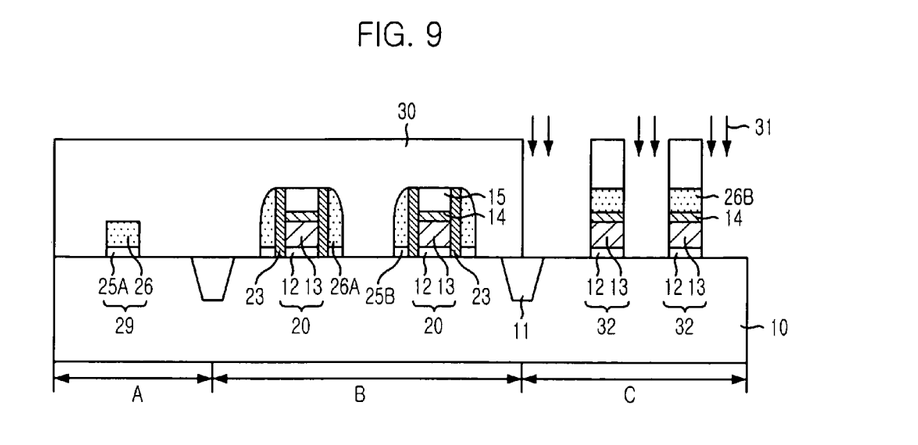

Next, as shown in FIG. 9, a strip process is performed, thereby removing the fourth photoresist pattern 27 (refer to FIG. 8).

Next, a fifth photoresist layer (not shown) is deposited. Afterwards, a photo exposure process and a developing process are performed by using a photomask, thereby forming a fifth photoresist pattern 30. At this time, the fifth photoresist pattern 30 covers the first region A and the second region B, and opens predetermined portions of the third region C.

Next, a fifth etching process 31 is performed by using the fifth photoresist pattern 30 as a mask and then, a plurality of second control gates 26B and a plurality of second floating gates 32 are formed on the substrate 10 of the third region C. At this time, the plurality of first inter-poly dielectric layers 14 are interposed between the second control gates 26B and the second floating gates 32. Herein, the first inter-poly dielectric layers 14 can function as a dielectric layer of a flash cell since the first inter-poly dielectric layers 14 are interposed between the second floating gates 32 and the second control gates 26B.

Figure 10:
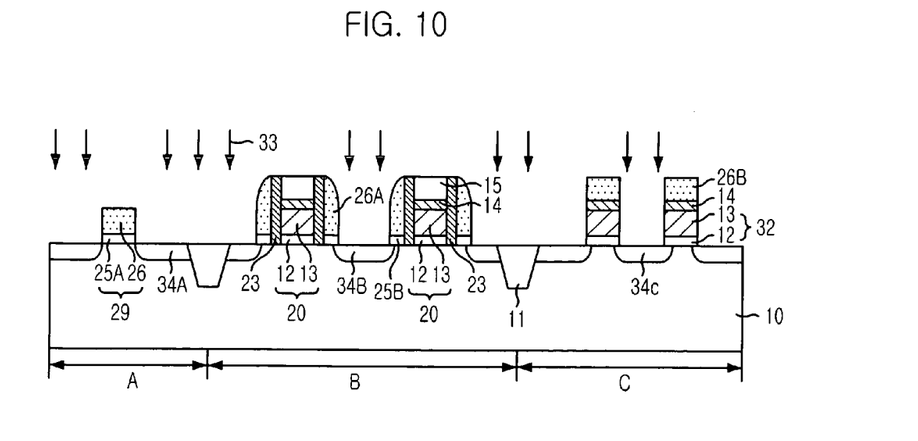

Next, as shown in FIG. 10, a strip process is performed, thereby removing the fifth photoresist pattern 30 (refer to FIG. 9).

Next, a lowly doped drain (LDD) ion-implantation process 33 is performed onto the resulting structure in which the fifth photoresist pattern 30 is removed. Thus, a plurality of lowly doped junction regions 34A to 34C are formed on the substrate 10 of the first region A, the second region B and the third region C, respectively.

Herein, the lowly doped junction regions 34A to 34C are formed in an N-type or a P-type. In case of forming the lowly doped junction regions 34A to 34C in the N-type, an impurity ion selected from a group consisting of arsenic (As), phosphorus (P) and indium (In) as a group five element is used. Meanwhile, in case of forming the lowly doped junction regions 34A to 34C in the P-type, an impurity ion selected from a group consisting of boron (B), $BF_2$, and antimony (Sb) as a group three element is used.

Figure 11:
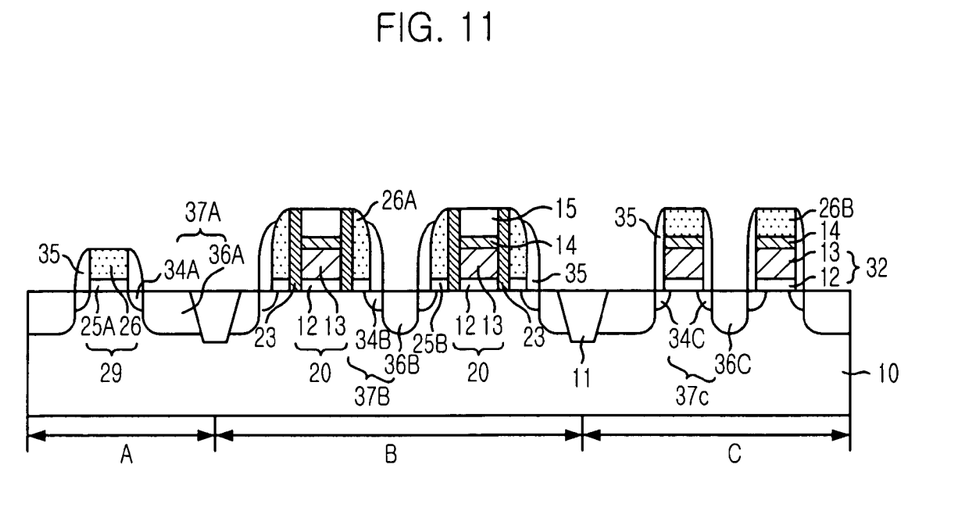

Next, as shown in FIG. 11, an insulation layer (not shown) is deposited over the resulting structure provided with the gate electrode 29, the first control gates 26A and the second control gates 26B. At this time, the insulation layer is formed by using a material selected from a group consisting of an oxide layer, a nitride layer and a combination thereof.

Next, a dry etching process is performed, thereby forming a plurality of spacers 35 on sidewalls of the gate electrode 29 of the first region A and the first control gates 26A of the second region B. Simultaneously, the plurality of spacers 35 are also formed on sidewalls of the resulting structures formed on the substrate 10 of the third region C.

Next, a highly doped source/drain ion-implantation process using the spacers 35 as a mask is performed and thus, a plurality of highly doped junction regions 36A to 36C are formed respectively on the substrate 10 of the first region A to the third region C exposed between the spacers 35. Accordingly, a first source/drain region to a third source/drain region 37A to 37C are formed. Herein, the first source/drain region to the third source/drain region 37A to 37C are formed in an N-type or a P-type.

Through the aforementioned fabrication method, the logic device is formed on the first region A; the EEPROM cell is formed on the second region B; and the flash memory cell is formed on the third region C.

That is, in accordance with the specific embodiment, the first polysilicon layer 13 serves a role of the floating gate of the EEPROM cell along with performing a role of the floating gate of the flash memory cell. Furthermore, the second polysilicon layer 26 serves a role of the gate electrode of the logic device along with performing roles of the control gate of the EEPROM cell and the control gate of the flash memory.

Accordingly, it is possible to not only form the EEPROM cell and the flash memory cell in only one chip at the same time, but also form the logic device, the EEPROM cell and the flash memory cell in only one chip at the same time.

As described above, in accordance with the specific embodiment, the floating gates of the EEPROM cell and the flash memory cell are formed by using the first polysilicon layer; and the gate electrode of the logic device and the control gates of the EEPROM cell and the flash memory cell are formed by using the second polysilicon layer. Thus, it is possible to stably form the logic device, the EEPROM cell and the flash memory cell in one chip.

Furthermore, in accordance with the specific embodiment, a memory cell area can be reduced and removal operations suitable for properties of the EEPROM cell and the flash memory cell can be independently performed.

Thus, it is possible to superlatively maintain capability of the EEPROM cell and the flash memory cell in one chip.

In the result, the present invention can be variously applied to products such as a CPU card, an IC card and a smart card. Particularly, it is possible to minimize a time required for developing products by replacing the mask ROM device of the smart card with the flash memory and reduce burden in inventory management which is the critical disadvantage of the mask ROM device.

The present application contains subject matter related to the Korean patent application No. KR 2005-0034713, filed in the Korean Patent Office on Apr. 26, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
   preparing a substrate defined as a first region, a second region and a third region;
   forming a stack structure on the substrate;
   exposing the substrate of the first region by etching the stack structure and simultaneously forming a plurality of first floating gates on the second region;
   forming second inter-poly dielectric layers on sidewalls of the first floating gates and a sidewall of the stack structure remaining on the third region;
   forming a gate oxide layer on the substrate of the second region exposed in both sides of the first floating gates and on the substrate of the first region;
   forming a second polysilicon layer over the gate oxide layer, the first floating gates and the stack structure;
   forming a gate electrode on the substrate of the first region by etching the second polysilicon layer and the gate oxide layer and simultaneously forming control gates on both sidewalls of the second inter-poly dielectric layers existing on the substrate of the second region; and
   forming second floating gates and second control gates by etching the second polysilicon layer, the second inter-poly silicon layer, the stack structure on the substrate of the third region.

2. The method of claim 1, wherein the stack structure includes a first insulation layer, a first polysilicon layer and a first inter-poly dielectric layer.

3. The method of claim 1, wherein the first region is a where a transistor for a logic device will be formed, a second region is where an electrical erasable programmable read only memory (EEPROM) cell will be formed, and a third region is where a flash memory cell will be formed.

4. The method of claim 1, after the forming of the plurality of second floating gates and the second control gates further including forming a plurality of source/drain regions in the substrate exposed by the gate electrode, the first control gates and the second control gates.

5. The method of claim 2, wherein the first insulation layer is an oxynitride layer including nitrogen.

6. The method of claim 2, wherein the first insulation layer is formed in a thickness ranging from approximately 50 Å to approximately 200 Å.

7. The method of claim 2, wherein the first polysilicon layer is formed in a thickness ranging from approximately 500 Å to approximately 5,000 Å.

8. The method of claim 2, wherein the first inter-poly dielectric layer is formed in a structure of an oxide layer, a nitride layer and an oxide layer (ONO).

9. The method of claim 2, after the depositing of the first inter-poly dielectric layer further including forming a second insulation layer on the first inter-poly dielectric layer.

10. The method of claim 9, wherein the second insulation layer includes one selected from the group consisting of an oxide layer, a nitride layer, an oxynitride layer, and a stack layer thereof.

11. The method of claim 9, wherein the forming of the plurality of first floating gates includes:
   etching the second insulation layer and the first inter-poly dielectric layer by using a mask;
   removing the mask; and
   etching the first polysilicon layer and the first insulation layer through an etching process by using the etched second insulation layer as an etch mask.

12. The method of claim 1, wherein the second inter-poly dielectric layers are formed in a structure of an oxide layer, a nitride layer and an oxide layer (ONO).

13. The method of claim 1, wherein the gate oxide layer is more thickly formed on the substrate of the first region than on the substrate of the second region.

14. The method of claim 13, wherein the gate oxide layer formed on the substrate of the first region has a thickness ranging from approximately 15 Å to approximately 200 Å.

15. The method of claim 13, wherein the gate oxide layer formed on the substrate of the second region has a thickness ranging from approximately 50 Å to approximately 500 Å.

16. The method of claim 13, wherein the gate oxide layer formed on the substrate of the second region is formed between the respective first control gate and the substrate.

17. The method of claim 1, wherein the second polysilicon layer is formed in a thickness ranging from approximately 500 Å to approximately 5,000 Å.

18. The method of claim 1, after the forming the plurality of second control gates further including forming a plurality of spacers on sidewalls of the first control gates, the second floating gates and the second control gates.

19. The method of claim 4, wherein the forming of the plurality of source/drain regions includes:
   forming a plurality of lowly doped junction regions in the substrate of the first region to the third region by performing a lightly doped drain (LDD) ion-implantation process;
   forming a third insulation layer over the gate electrode, the first control gates, and the second control gates;
   forming a plurality of spacers on sidewalls of the gate electrode, the first control gates, the second floating gates and the second control gates; and
   forming a plurality of highly doped junction regions in both sides of the spacers in the substrate of the first region to the third region through performing a highly doped source/drain ion-implantation process using the spacers as a mask.

20. The method of claim 19, wherein the lowly doped junction regions comprise an N-type, an impurity ion selected from the group consisting of arsenic (As), phosphorous (P) and indium (In) is used.

21. The method of claim 19, wherein the lowly doped junction regions comprise a P-type, an impurity ion selected from the group consisting of boron (B), $BF_2$ and antimony (Sb) is used.

22. The method of claim 19, wherein the third insulation layer includes one selected from the group consisting of an oxide layer, a nitride layer and a combination thereof.

* * * * *